(12) United States Patent
Kim et al.

(10) Patent No.: US 9,601,684 B2
(45) Date of Patent: Mar. 21, 2017

(54) PIEZOELECTRIC ELEMENT AND PIEZOELECTRIC VIBRATOR HAVING THE SAME

(71) Applicant: SAMSUNG ELECTRO-MECHANICS CO., LTD., Suwon-Si, Gyeonggi-Do (KR)

(72) Inventors: Boum-Seock Kim, Suwon-Si (KR); Kyung-Mi Kim, Suwon-Si (KR); Seung Ho Lee, Suwon-Si (KR); Kyung-Lock Kim, Suwon-Si (KR); Jung-Wook Seo, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 511 days.

(21) Appl. No.: 14/284,168

(22) Filed: May 21, 2014

(65) Prior Publication Data
US 2015/0270476 A1 Sep. 24, 2015

(30) Foreign Application Priority Data
Mar. 24, 2014 (KR) .......... 10-2014-0034084

(51) Int. Cl.
*H01L 41/187* (2006.01)
*H01L 41/09* (2006.01)
*H01L 41/083* (2006.01)
*B06B 1/06* (2006.01)

(52) U.S. Cl.
CPC ........ *H01L 41/0838* (2013.01); *B06B 1/0603* (2013.01); *H01L 41/1876* (2013.01)

(58) Field of Classification Search
CPC ..................................... B06B 1/0603
USPC ................................. 310/311–371
See application file for complete search history.

(56) References Cited

U.S. PATENT DOCUMENTS

| 8,142,677 | B2 * | 3/2012 | Hirose | C04B 35/491 |
| | | | | 252/62.9 PZ |
| 2002/0036679 | A1 * | 3/2002 | Ueki | B41J 2/14209 |
| | | | | 347/72 |
| 2003/0096696 | A1 * | 5/2003 | Nada | C01G 23/002 |
| | | | | 501/134 |
| 2008/0136293 | A1 * | 6/2008 | Mochizuki | H01L 41/0471 |
| | | | | 310/358 |
| 2008/0211880 | A1 * | 9/2008 | Hara | B41J 2/161 |
| | | | | 347/70 |
| 2009/0152996 | A1 * | 6/2009 | Koizumi | C04B 35/493 |
| | | | | 310/358 |

(Continued)

*Primary Examiner* — Thomas Dougherty
(74) *Attorney, Agent, or Firm* — McDermott Will & Emery LLP

(57) ABSTRACT

Disclosed are a piezoelectric element and a piezoelectric vibrator having the same. The piezoelectric element and the piezoelectric vibrator having the same in accordance with an embodiment of the present invention include: a piezoelectric material formed by laminating a plurality of ceramic layers with one another; internal electrodes formed, respectively, on surfaces of the ceramic layers; and a pair of cover layers formed, respectively, above and below the piezoelectric material in order to protect the internal electrodes, and at least one of the cover layers includes: a plurality of crystal grains; and crack inhibiting particles disposed at boundaries between the plurality of crystal grains and configured to inhibit a crack from spreading in the cover layers.

15 Claims, 3 Drawing Sheets

(56) References Cited

U.S. PATENT DOCUMENTS

2010/0320871 A1* 12/2010 Suenaga ............... C04B 35/495
                                                        310/330
2015/0028444 A1*  1/2015 Noda ........................ G01J 5/34
                                                        257/466

* cited by examiner

PIEZOELECTRIC ELEMENT AND PIEZOELECTRIC VIBRATOR HAVING THE SAME

CROSS-REFERENCE TO RELATED APPLICATIONS

This application claims the benefit of Korean Patent Application No. 10-2014-0034084, filed with the Korean Intellectual Property Office on Mar. 24, 2014, the disclosure of which is incorporated herein by reference in its entirety.

BACKGROUND

1. Technical Field

The present invention relates to a piezoelectric element and a piezoelectric element having the same.

2. Background Art

Touch panels, touch keyboards and the like can be installed on electronic devices to provide vibrations to user's fingertips when letters or drawings are inputted. Such a function of providing a tactile feedback for inputting letters or drawings is referred to as a haptic function.

A haptic device utilizes a structure in which a transparent touch panel is tightly attached to an image display device, such as an LCD, and vibrations are transferred to a user by having the vibrations provided to the touch panel by a vibration generating means, such as a vibration motor or a piezoelectric actuator, when the user presses and operates the touch panel while looking at an image through the touch panel.

Vibration motors are slow in reaction, making it unfit for devices requiring rapid touches. On the other hand, piezoelectric actuators have a fast reaction speed and are capable of realizing various frequencies.

Piezoelectric ceramics can be used for the piezoelectric actuators. When the piezoelectric ceramics vibrate according to the piezoelectric properties thereof, a ceramic layer forming the piezoelectric material may be cracked.

The related art of the present invention is disclosed in Korea Patent Publication No. 10-2011-0131632 (HAPTIC DEVICE; laid open on Dec. 7, 2011).

SUMMARY

The present invention provides a piezoelectric element and a piezoelectric vibrator having the same that can reduce occurrence of cracks.

According to an aspect of the present invention, the piezoelectric element in accordance with an embodiment of the present invention includes: a piezoelectric material formed by laminating a plurality of ceramic layers with one another; internal electrodes formed, respectively, on surfaces of the ceramic layers; and a pair of cover layers formed, respectively, above and below the piezoelectric material in order to protect the internal electrodes, and at least one of the cover layers includes: a plurality of crystal grains; and crack inhibiting particles disposed at boundaries between the plurality of crystal grains and configured to inhibit a crack from spreading in the cover layers.

The crack inhibiting particles can be disposed at points where at least three crystal grains of the plurality of crystal grains meet with one another.

The plurality of crystal grains can be made of lead zirconate titanate (PZT), and the crack inhibiting particles can include at least one of aluminum oxide ($Al2O3$) and silicon carbide (SiC).

A sintering initiation temperature of the crack inhibiting particles can be higher than a sintering initiation temperature of the crystal grains.

On a cross-sectional plane of the cover layers, a ratio of cross-sectional areas of the crack inhibiting particles to an entire cross-sectional area of the cover layers can be greater than or equal to 0.3 and less than or equal to 3.

The piezoelectric element can further include a via penetrating the piezoelectric material so as to connect the internal electrodes formed, respectively, on the ceramic layers with one another.

The piezoelectric element can further include a terminal having one end thereof exposed so as to be connected with an external circuit and having the other end thereof electrically connected with the internal electrodes.

According to another aspect of the present invention, the piezoelectric vibrator in accordance with an embodiment of the present invention includes: a piezoelectric material formed by laminating a plurality of ceramic layers with one another; internal electrodes formed, respectively, on surfaces of the ceramic layers; a pair of cover layers formed, respectively, above and below the piezoelectric material in order to protect the internal electrodes; and a vibrating plate coupled with a cover layer of the pair of cover layers that is formed below the piezoelectric material and configured to vibrate as a result of expansion and contraction of the piezoelectric material when electric power is supplied through the internal electrodes, and at least one of the cover layers includes: a plurality of crystal grains; and crack inhibiting particles disposed at boundaries between the plurality of crystal grains and configured to inhibit a crack from spreading in the cover layers.

The crack inhibiting particles can be disposed at points where at least three crystal grains of the plurality of crystal grains meet with one another.

The plurality of crystal grains can be made of lead zirconate titanate (PZT), and the crack inhibiting particles can include at least one of aluminum oxide ($Al2O3$) and silicon carbide (SiC).

A sintering initiation temperature of the crack inhibiting particles can be higher than a sintering initiation temperature of the crystal grains.

On a cross-sectional plane of the cover layers, a ratio of cross-sectional areas of the crack inhibiting particles to an entire cross-sectional area of the cover layers can be greater than or equal to 0.3 and less than or equal to 3.

The piezoelectric vibrator can further include a via penetrating the piezoelectric material so as to connect the internal electrodes formed, respectively, on the ceramic layers with one another.

The piezoelectric vibrator can further include a terminal having one end thereof exposed so as to be connected with an external circuit and having the other end thereof electrically connected with the internal electrodes.

The piezoelectric vibrator can further include an adhesive material interposed between the vibrating plate and the cover layer of the pair of cover layers that is formed below the piezoelectric material.

According to the embodiment of the present invention, the piezoelectric element and the piezoelectric vibrator can have an increased durability and an extended product life.

DETAILED DESCRIPTION

Figure 1:
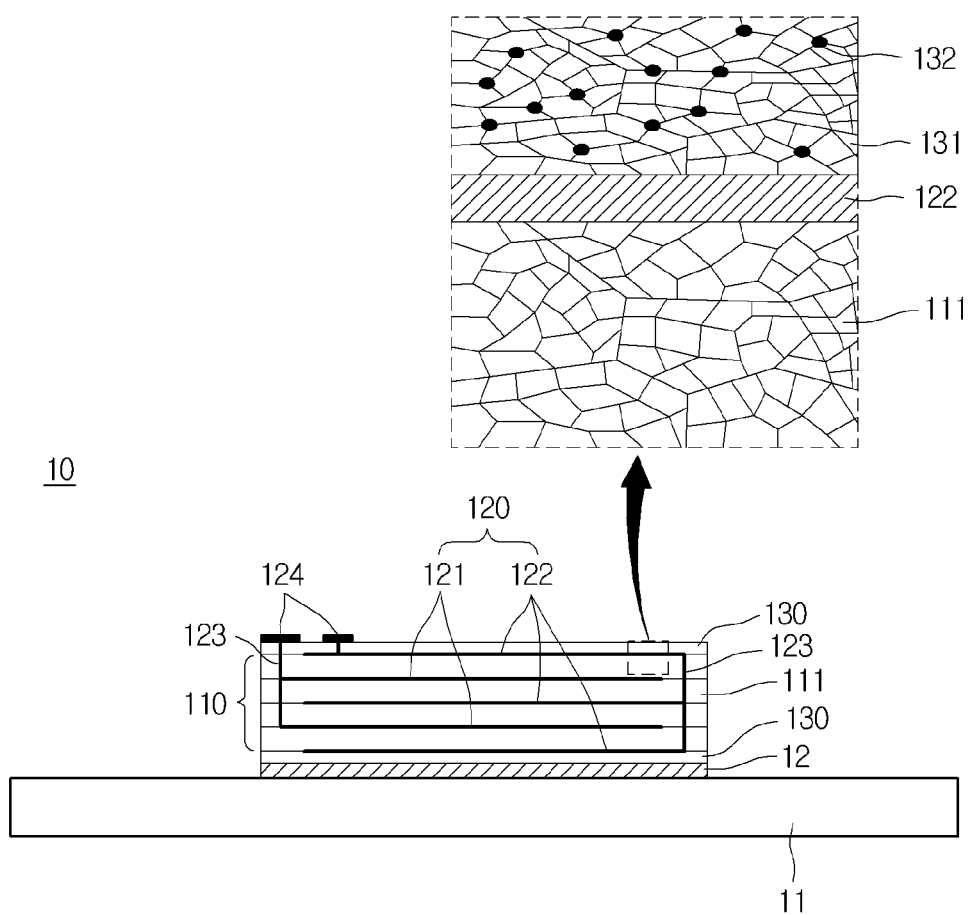
FIG. 1 shows a piezoelectric vibrator in accordance with an embodiment of the present invention.

Hereinafter, certain embodiments of a piezoelectric element and a piezoelectric vibrator having the same in accordance with the present invention will be described in detail with reference to the accompanying drawings. In describing certain embodiments of the present invention with reference to the accompanying drawings, any identical or corresponding elements will be assigned with same reference numerals, and their redundant description will not be provided.

Terms such as "first" and "second" can be used in describing various elements, but the above elements shall not be restricted to the above terms. The above terms are used only to distinguish one element from the other.

When one element is described as being "coupled" or "connected" to another element, it shall be construed as not only being in physical contact with the other element but also as possibly having a third element interposed therebetween and each of the one element and the other element being in contact with the third element.

Figure 2:
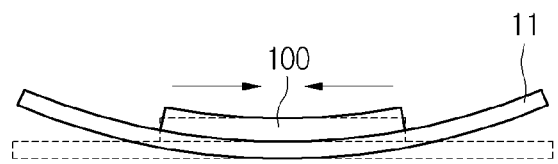
FIG. 2 and FIG. 3 show vibrations of the piezoelectric vibrator in accordance with an embodiment of the present invention.
Figure 4:
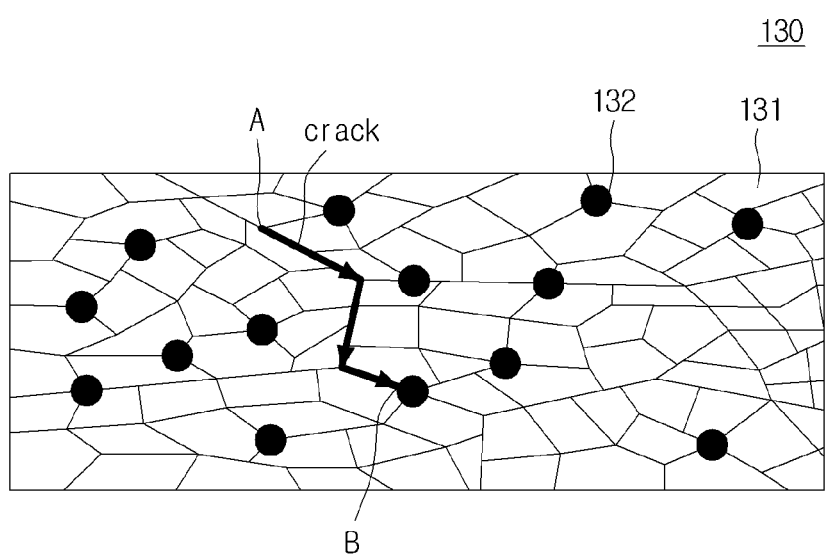
FIG. 4 shows a portion of a piezoelectric element in accordance with an embodiment of the present invention.

FIG. 1 shows a piezoelectric vibrator in accordance with an embodiment of the present invention, and FIG. 2 and FIG. 2 show vibrations of the piezoelectric vibrator in accordance with an embodiment of the present invention. FIG. 4 shows a portion of a piezoelectric element in accordance with an embodiment of the present invention.

Referring to FIG. 1, a piezoelectric vibrator 10 can include a vibrating plate 11 and a piezoelectric element 100. The piezoelectric element 100 can include piezoelectric material 110, internal electrodes 120 and cover layers 130.

The vibrating plate 11 is a plate designed to vibrate up and down according to movement of the piezoelectric element 100 and can be made of a steel material. The vibrating plate 11 can perform a function of transferring vibrations to a touch panel or an image display unit and can be attached to the touch panel or the image display unit.

The piezoelectric element 100 is an element that is formed on one surface of the vibrating plate 11 and vibrates the vibrating plate 11. The piezoelectric element 100 can be readily attached to the vibrating plate 11 by an adhesive material 12. Here, the adhesive material 12 can be made of an insulating material, such as epoxy resin, to insulate the piezoelectric element 100 from the vibrating plate 11.

Figure 3:
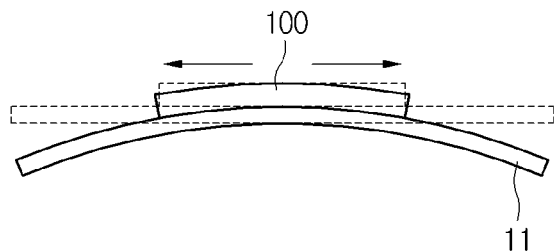

As shown in FIGS. 2 and 3, the piezoelectric element 100 can contract and expand in latitudinal directions when voltage is applied, and the vibrating plate 11 can vibrate up and down accordingly.

As described above, the piezoelectric element 100 can include the piezoelectric material 110, the internal electrodes 120 and the cover layers 130.

The piezoelectric material 110 can be formed by laminating a plurality of ceramic layers 111 with one another. The ceramic layers 111 can be made of a material including lead zirconate titanate (PZT). Each of the ceramic layers 111 can have a thickness of about 80 um.

When voltage is applied to the piezoelectric material 110, an electric field is formed in between two electrodes on the ceramic layers 111, and structures of the ceramic layer 111 can be changed by a dipole occurred inside the ceramic layers 111. The piezoelectric material 110 can be contracted and expanded in latitudinal directions according to the structural change in the ceramic layers 111.

A high voltage is required in order to obtain a large displacement (contraction and expansion) of the piezoelectric material 110. However, in the case where the piezoelectric element 100 is constituted with a plurality of ceramic layers, the distance between the electrodes becomes smaller than when the piezoelectric element 100 is constituted with a single ceramic layer, and thus a larger displacement can be resulted from a same voltage. Accordingly, it is more efficient to form the piezoelectric material 110 with a plurality of ceramic layers.

The internal electrodes 120 are electrodes formed on surfaces of the ceramic layers 111 and can include first electrodes 121 and second electrodes 122. One of the first electrodes 121 and the second electrodes 122 is formed on each of the ceramic layers 111 to have one of the positive (+) or negative (−) polarities. In such a case, by having the first electrodes 121 and the second electrodes 122 to be alternated and arranged in parallel with one another, an electric field can be formed in the ceramic layers 111 when voltage is applied.

The internal electrodes 120 can be formed by having an electrode paste printed and then sintered. An area of the electrode paste printed on a single ceramic layer 111 can be smaller than or equal to an area of the single ceramic layer 111.

In the case where the piezoelectric material 110 is constituted with four ceramic layers 111, as shown in FIG. 1, there can be two first electrodes 121 and three second electrodes 122. Here, the first electrodes 121 are formed inside the piezoelectric material 110 only and thus are not exposed, but some of the second electrodes 122 are formed on surfaces of upper-most and lower-most ceramic layers 111 and thus can be exposed. Here, the upper-most ceramic layer 111 refers to the ceramic layer 111 that is farthest away from the vibrating plate 11, and the lower-most ceramic layer 111 refers to the ceramic layer 111 that is closest to the vibrating plate 11.

If the piezoelectric material 110 is constituted with an odd number of ceramic layers 111, there can be equal numbers of the first electrodes 121 and the second electrodes 122, some of the first electrodes 121 and the second electrodes 122 can be both exposed.

The internal electrodes 120 formed on different ceramic layers 111 can be electrically connected with one another by via 123, which is formed by penetrating the piezoelectric material 110. There can be two kinds of via 123, one for connecting the first electrodes 121 with one another and the other for connecting the second electrodes 122 with one another. The plurality of internal electrodes 120 formed, respectively, on different layers can be readily connected with one another by use of the via 123, making it easier to manufacture the piezoelectric element 100.

Moreover, the piezoelectric element 100 can further include terminals 124 that are electrically connected with the internal electrodes 120. The terminals 124 are portions that are contacted with an external circuit (not shown). One ends of the terminals 124 are exposed to be in contact with the external circuit, and the other ends of the terminals 124 are connected with the internal electrodes 120. There can be also two kinds of terminals 124, one for being connected with the first electrodes 121 and the other for being connected with the second electrodes 122.

The cover layers 130 are a pair of layers formed above and below the piezoelectric material 110, respectively, in order to protect the exposed internal electrodes 120. Each of the cover layers 130 can have a thickness of about 30 um. Since the cover layers 130 function to protect the electrodes, each of the cover layers 130 can be formed to be thinner than each of the ceramic layers 111 in order to save material costs.

At least one of the cover layers 130 can be constituted with a plurality of crystal grains 131, and crack inhibiting particles 132 can be disposed at boundaries between the plurality of crystal grains 131.

As illustrated in FIGS. 2 and 3, when the piezoelectric material 110 vibrates, the cover layers 130 are not formed with an electric field and thus cannot be expanded and contracted as much as the piezoelectric material 110. Therefore, it is highly likely that a crack is occurred within the cover layers 130. The crack occurred in the cover layers 130 can be possibly spread to the piezoelectric material 110.

The crack is spread through the boundaries between the plurality of crystal grains 131, and as the piezoelectric material 110 has a crystal structure also, the crack continues to spread through the boundaries between these crystal structures. The crack inhibiting particles 132 of the present invention can function to stop the crack from spreading. That is, by stopping the crack from spreading in the cover layers 130, it becomes possible to prevent the crack from spreading throughout the piezoelectric material 110.

As illustrated in FIG. 4, the crack can occur at point A and be spread through the boundaries between the crystal grains 131. However, the crack cannot be spread beyond the crack inhibiting particles 132 and can be stopped from spreading at point B.

If there were no crack inhibiting particles 132, the crack having occurred at point A could be spread throughout the cover layers 130 and to the piezoelectric material 110, possibly cracking the piezoelectric element 100. Since the crack inhibiting particles 132 prevents the piezoelectric element 100 from cracking, the durability of the piezoelectric element 100 can be improved.

The crack inhibiting particles 132 can be disposed at points where at least three crystal grains 131 meet. In the case where the piezoelectric element 100 is sintered, since energy at the points where three crystal grains 131 meet is high, the crack inhibiting particles 132 can be easily placed at these points. Moreover, the crack inhibiting particles 132 can be disposed on boundary lines where two crystal grains 131 meet.

In the case where the piezoelectric element 100 is sintered, a sintering initiation temperature of the crack inhibiting particles 132 can be higher than a sintering initiation temperature of the crystal grains 131. In other words, the crack inhibiting particles 132 may remain unsintered even after the crystal grains 131 are sintered. The melting point of the crack inhibiting particles 132 can be higher than the melting point of the crystal grains 131.

Similarly to the piezoelectric material 110, the plurality of crystal grains 131 of the cover layer 130 can be made of PZT. In such a case, the crack inhibiting particles 132 can include at least one of aluminum oxide ($Al_2O_3$) and silicon carbide (SiC).

For example, the cover layer 130 can be made of PZT powder, solvent, binder and silicon carbide (or aluminum oxide). In such a case, the weight % of the silicon carbide (or aluminum oxide) can greater than or equal to 0.1 wt % and less than or equal to 1 wt %.

Moreover, on a cross-sectional plane of the cover layer 130, a ratio of cross-sectional areas of the crack inhibiting particles 132 to an entire cross-sectional area of the cover layer 130 can be greater than or equal to 0.3 and less than or equal to 3.

The crack inhibiting particles 132 can be included in both of the pair of cover layers 130 or can be included, if necessary, in the cover layer 130 placed in an upper portion.

In the case where the piezoelectric vibrator 10 vibrates, a point where stress is zero in the piezoelectric vibrator 10 is near a bottom at a center of the piezoelectric element 100.

In other words, the piezoelectric element 100 has the largest stress at an upper-most portion thereof, and thus the cover layer formed above the piezoelectric material 110 is more likely to have a crack occurred therein when the piezoelectric element 100 vibrates. On the other hand, the cover layer formed below the piezoelectric material 110 is less likely to have a crack occurred therein.

Therefore, in order to save costs, it is possible to have the crack inhibiting particles 132 included in the cover layer formed above the piezoelectric material 110, instead of both of the pair of cover layers 130.

As described above, with the piezoelectric element and the piezoelectric vibrator having the same in accordance with an embodiment of the present invention, it becomes possible to prevent a crack from occurring in the piezoelectric element by inhibiting the crack from spreading in the cover layer. Accordingly, the piezoelectric element and the piezoelectric vibrator can have an increased durability and an extended product life.

Although certain embodiments of the present invention have been described, it shall be appreciated that a number of permutations and modifications of the present invention are possible by those who are ordinarily skilled in the art to which the present invention pertains by supplementing, modifying, deleting and/or adding some elements without departing from the technical ideas of the present invention that are disclosed in the claims appended below and that such permutations and modifications are also covered by the scope of the present invention.

What is claimed is:

1. A piezoelectric element comprising:
   a piezoelectric material formed by laminating a plurality of ceramic layers with one another;
   internal electrodes formed, respectively, on surfaces of the ceramic layers; and
   a pair of cover layers formed, respectively, above and below the piezoelectric material in order to protect the internal electrodes,
   wherein at least one of the cover layers comprises:
   a plurality of crystal grains; and
   crack inhibiting particles disposed at boundaries between the plurality of crystal grains and configured to inhibit a crack from spreading in the cover layers.

2. The piezoelectric element of claim 1, wherein the crack inhibiting particles are disposed at points where at least three crystal grains of the plurality of crystal grains meet with one another.

3. The piezoelectric element of claim 1, wherein the plurality of crystal grains are made of lead zirconate titanate (PZT), and
   wherein the crack inhibiting particles include at least one of aluminum oxide ($Al_2O_3$) and silicon carbide (SiC).

4. The piezoelectric element of claim 1, wherein a sintering initiation temperature of the crack inhibiting particles is higher than a sintering initiation temperature of the crystal grains.

5. The piezoelectric element of claim 1, wherein on a cross-sectional plane of the cover layers, a ratio of cross-sectional areas of the crack inhibiting particles to an entire cross-sectional area of the cover layers is greater than or equal to 0.3 and less than or equal to 3.

6. The piezoelectric element of claim 1, further comprising a via penetrating the piezoelectric material so as to connect the internal electrodes formed, respectively, on the ceramic layers with one another.

7. The piezoelectric element of claim 1, further comprising a terminal having one end thereof exposed so as to be connected with an external circuit and having the other end thereof electrically connected with the internal electrodes.

8. A piezoelectric vibrator comprising:
a piezoelectric material formed by laminating a plurality of ceramic layers with one another;
internal electrodes formed, respectively, on surfaces of the ceramic layers;
a pair of cover layers formed, respectively, above and below the piezoelectric material in order to protect the internal electrodes; and
a vibrating plate coupled with a cover layer of the pair of cover layers that is formed below the piezoelectric material and configured to vibrate as a result of expansion and contraction of the piezoelectric material when electric power is supplied through the internal electrodes,
wherein at least one of the cover layers comprises:
a plurality of crystal grains; and
crack inhibiting particles disposed at boundaries between the plurality of crystal grains and configured to inhibit a crack from spreading in the cover layers.

9. The piezoelectric vibrator of claim 8, wherein the crack inhibiting particles are disposed at points where at least three crystal grains of the plurality of crystal grains meet with one another.

10. The piezoelectric vibrator of claim 8, wherein the plurality of crystal grains are made of lead zirconate titanate (PZT), and
wherein the crack inhibiting particles include at least one of aluminum oxide ($Al_2O_3$) and silicon carbide (SiC).

11. The piezoelectric vibrator of claim 8, wherein a sintering initiation temperature of the crack inhibiting particles is higher than a sintering initiation temperature of the crystal grains.

12. The piezoelectric vibrator of claim 8, wherein on a cross-sectional plane of the cover layers, a ratio of cross-sectional areas of the crack inhibiting particles to an entire cross-sectional area of the cover layers is greater than or equal to 0.3 and less than or equal to 3.

13. The piezoelectric vibrator of claim 8, further comprising a via penetrating the piezoelectric material so as to connect the internal electrodes formed, respectively, on the ceramic layers with one another.

14. The piezoelectric vibrator of claim 8, further comprising a terminal having one end thereof exposed so as to be connected with an external circuit and having the other end thereof electrically connected with the internal electrodes.

15. The piezoelectric vibrator of claim 8, further comprising an adhesive material interposed between the vibrating plate and the cover layer of the pair of cover layers that is formed below the piezoelectric material.

* * * * *